March 10, 1964 H. MÉGARD 3,124,763

WIRELESS RECEIVER SET

Filed Feb. 9, 1959

Inventor:
Henry MÉGARD
by: Delattre-Seguy
Attorney 3,124,763

WIRELESS RECEIVER SET

Henry Megard, Geneva, Switzerland, assignor to Sautier & Jaeger, Geneva, Switzerland, a firm Filed Feb. 9, 1959, Ser. No. 791,942
Claims priority, application Switzerland Jan. 26, 1954
4 Claims. (Cl. 330—78)

The present application is a continuation-in-part of my prior co-pending application 464,147, filed October 22, 1954.

The present invention relates ot high-frequency amplifiers and particularly to radio frequency amplifier stages having extremely wide bandwidth as required for combined radio and television receiver sets.

In all high frequency amplifier stages and particularly in such stages used for amplifying signals in the very high and ultra high frequency ranges one very serious problem is encountered, namely the undesired feed-back of the amplified signal to the input of the amplifier stage caused by the inherent capacity between the output terminal, that is to say the anode if the utilized amplifying means is a vacuum tube as usual, and the input terminal, that is to say the control grid in the case of a vacuum tube. This inherent capacity is unavoidable and has a magnitude which leads to said undesired feed-back in the higher frequency ranges as they are used for television and frequency modulation broadcasting, so that each amplifier stage utilized to amplify signals in these frequency ranges will sing unavoidably which would render any amplifying of such signals impossible.

Therefore, it is an object of the instant invention to provide an amplifier stage in which the undesirable positive feed-back, caused by the inherent capacity between the output and the input terminals of an amplifying means, in the case of a vacuum tube provided with an anode and a control grid, is eliminated over a wide frequency band.

It is further an object of the invention to provide a radio frequency amplifier stage having extremely wide bandwidth for use in combined radio and television receiver sets.

It is a feature of the instant invention to have inductive means in an amplifier stage of the type referred to which are placed in the circuit to provide for inductive negative feedback from the output to the input of the amplifier stage. Such inductive negative feed-back can easily be adjusted so as to be equal in magnitude to the positive feed-back caused by said inherent capacity, and its frequency will increase in the same proportions as does the positive feed-back caused by the inherent capacity.

It is known in the art that the impedance of a capacitance decreases with increasing frequency so that the positive feed-back increases, while the impedance of an inductance increases with increasing frequency so that the negative feed-back increases in the same proportion. Accordingly, by choosing the value of the inductance referred to above it is possible to counteract the effect of the inherent capacity over a wide frequency range as is necessary for receivers intended to receive a wide frequency range, for example combined radio and television receiver sets.

The invention will be more clearly understood from the following detailed description of a specific embodiment thereof and by reference to the accompanying drawing.

Figure 1:
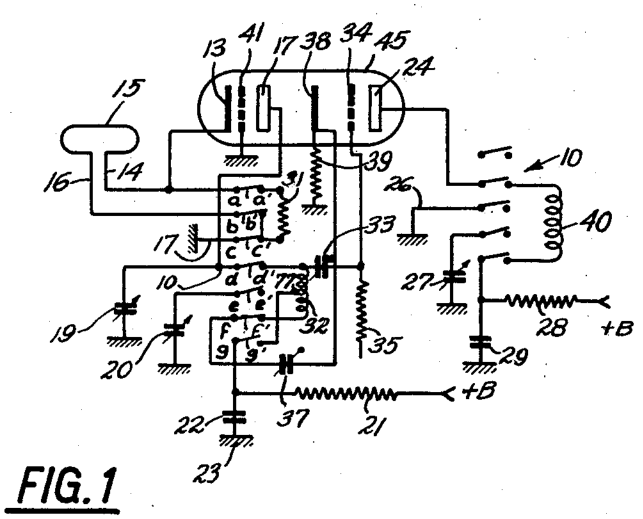
FIG. 1, shows an input stage of the set according to this invention with a part of the selector switch in its open condition, which part is closed to select one of the V.H.F. or U.H.F. bands.

Referring to FIG. 1, there is shown a multi-stage selector-switch, of a type known in the art, which is operated by hand.

It is to be understood that, in selector-switch 10, with reference to the plurality of positions or stages with which it is provided, one stage for each circuit connection can be altered when it is desired to proceed from one mode of operation of the receiver set to another mode as will be clear to those skilled in the art.

The stages of the selector switch 10 shown in FIG. 1, when the selector switch is actuated, alter the circuit connections in the intermediate frequency stage at the output of an intermediate frequency amplifier (not shown) so that the positions of the selector switch for frequency modulation and for television said intermediate frequency amplifier acts to amplify an intermediate frequency in the megacycle range, while in the position for long waves, medium waves, and short waves said intermediate amplifier stage is switched over to amplify an intermediate frequency in the kilocycle range, as is known in the art so that a further description of the method by which such switching is performed is deemed unnecessary.

Turning again to FIG. 1 of the drawing, there is shown the input stage of the combined radio and television receiver set together with the selector switch 10. Some stages of said selector switch 10 are shown in FIG. 1 as a number of open switches the movable contacts or blades of which are interconnected by a broken line.

For clarity of the drawing the stages shown in FIG. 1 of the drawing are not all shown in one line but in two separate parts. At this point it may be of interest to note that said selector switch 10 must not absolutely be one switch having a plurality of stages but it may also be a plurality of multi-stage switches which are controlled by one common relay or actuating lever or whatever is desired. Such switches, however, are known and are widely used in the art so that a detailed description is deemed unnecessary.

In FIG. 1 the following parts of the first or input stage of a combined radio and television receiver set are shown to be connected each to a respective blade or movable contact of the selector switch 10:

Cathode 13 and one end 14 of commonly used dipole antenna 15; the other end 16 of the aerial 15;

Ground at 17;

The anode 18 of the first triode together with a variable tuning capacitor 19;

Another variable tuning capacitor 20;

One end of an adjustable capacitor 37 the other end of which is connected to the cathode 38 of the second triode which cathode is connected to ground by a cathode resistor 39;

A load resistor 21 together with a decoupling capacitor 22, the other end of which load resistor leads to the positive pole of the battery while the other end of said decoupling capacitor is grounded as shown at 23 as well as the other ends of both the variable capacitors 19 and 20 as shown.

The blades of the second part of the selector switch 10 shown in the right-hand part of FIG. 1 are connected to:

The anode 24 of a second triode being disposed in a common envelope 25 with the first triode referred to above;

Ground at 26;

A variable capacitor 27 the other end of which is grounded;

A load resistor 28 together with a decoupling capacitor 29, the other end of which load resistor leads to the positive terminal of battery and the other end of which capacitor is grounded as shown at 30.

Now turning to the fixed contacts of the selector switch 10 there are only shown the fixed contacts of the stages represented which will be connected to the movable contacts or blades where a particular position of the switch 10 according to frequency modulation or television broadcasting is selected. The other contacts of the represented stages are omitted to render the drawing more readable. To these fixed contacts are connected (said fixed contacts are enumerated in the same order as the movable contacts or blades, above, to which they may be connected):

The first contact of the left-hand part of the selector switch 10 shown in FIG. 1 is connected to one end of a cathode resistor 31; the following two fixed contacts are commonly connected to the other end of said cathode resistor 31;

The next fixed contact is connected to one end of an inductance coil 32 together with one end of an adjustable capacitor 33, the other end of which capacitor is connected to the control grid 34 of said second triode together with one end of grid resistance 35 the other end of which resistance is connected to the automatic volume control line, but may also be connected to ground;

The next fixed contact is free of any connection;

The next fixed contact is connected to the other end of said inductance coil 32;

And the last fixed contact of the left-hand part of the selector switch of FIG. 1 is connected to a tap 36 of said inductance coil 32.

An inductance coil 40 is by proper operation of the selector switch 10 connected to the anode 24 of the 2nd triode with one end and with the other end to the connection of the load resistor 28 and the decoupling condenser 29.

To complete the description of the circuit of FIG. 1 it is to be noted that the grid 41 of the 1st triode is connected directly to ground so that that first triode appears in the grounded grid configuration which is particularly useful when a signal from a low impedance source is to be amplified as is the case in the signal received and delivered by a dipole aerial as 15 as usual in the art to receive high frequency waves as are used in FM and TV broadcasting.

In operation, that is to say when the selector switch 10 is actuated by hand to be in the position for receipt of one of the higher frequency bands as FM or television broadcasting so that the movable blade contacts rest on the fixed contacts shown in FIG. 1, waves received by the aerial 15 appear over the cathode resistor 31 of the 1st triode. As one end of said resistor is grounded at 17 the potential of the cathode will vary in accordance with the signal waves received by the antenna 15. As the potential of the grid 41 of the first triode is grounded and therefore is fairly constant, every variation of the cathode potential will lead to variations in the current flowing between cathode and anode and in the rest of the corresponding circuit. The anode being connected to a series resonance circuit consisting of the inductance coil 32 and the variable capacitor 20 and afterwards through anode resistor 21 to battery, the potential of the anode will vary in accordance with said varying current but, as the resistance of the anode- or output-circuit of the 1st triode is much higher than the resistance of the cathode- or in this case input-circuit the variations of the potential of the anode will be much greater, that means the incoming signal waves are amplified. These amplified signal waves are fed over capacitor 33 to the grid 34 of the 2nd triode where they are further amplified and fed through the inductance 40 in the anode circuit to following stages, for example a mixing stage as is known in the art so that a further description is deemed not necessary.

As mentioned above in the frequency ranges involved in FM and TV broadcasting the inherent capacity between the anode and the grid of a vacuum tube as well as other inherent capacities tend to cause feedback between the anode circuit and input circuit so that singing of the considered amplifier stage would occur if no precautions are taken.

In the first triode the danger of singing caused by undesired feedback from the anode to the input circuit is considerably reduced by grounding the grid 41, that means having a low impedance signal source in the cathode so that by proper selectioning of the tube type and careful mounting of all circuit elements singing effectively can be avoided.

The danger however is much more severe in the case of the 2nd triode where not only the output but also the input circuit has high impedance. In accordance with my invention I have therefore provided the tap 36 on the coil 32 and I have connected this tap to ground while I connect the end of said coil 32 far from the anode 18 of the first triode via capacitor 37 to the cathode 38 of the 2nd triode. By doing so I provide for a negative feedback from the cathode of the 2nd triode to its grid so that I can omit any neutralizing capacitor or series inductance for the inherent capacity between anode and grid of the tube and therefore can achieve an extremely wide bandwith heretofore not believed to be possible.

Figure 2:
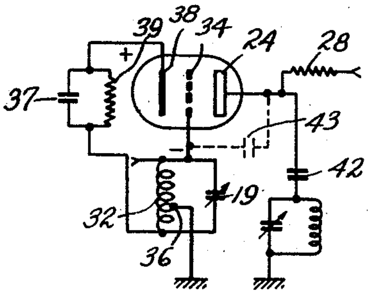
FIG. 2, shows in a simplified manner the equivalent alternating current circuit for the 2nd stage of the circuit in FIG. 1.

To explain the operation of my negative feedback feature I have shown in FIG. 2 a simplified circuit diagram of the circuit of FIG. 1. FIG. 2 actually shows the 2nd triode together with the parts of the circuit being of influence to the signal waves while all the parts only intended to influence its direct current are omitted for sake of clarity. Further for sake of clarity I have made some minor changes which are the full equivalent of the actual connections shown in FIG. 1 but which render the operation of the represented circuit more readily understandable, while the actual connections shown in FIG. 1 facilitate the practical construction of my amplifier stage.

Turning now in particular to FIG. 2 it is assumed that the parallel resonance circuit consisting of the inductance 32 and the capacitor 19 is tuned to the band which is intended to be received. Now when such a signal wave is amplified in the preceding 1st triode a corresponding voltage will appear on the grid 34 so that the anode current of the 2nd triode will vary accordingly, together with the potential of the anode 24, as caused by the load resistor 28 together with the parallel resonance circuit coupled to said anode by capacitor 42. These variations in the potential of anode 24 are fed back to the grid 34 over the inherent capacity between anode 24 and grid 34 represented by 43 in broken lines to indicate that no actual capacitor is in the circuit.

As the voltage fed back by the inherent capacitance 43 from the anode to the grid has substantially the same phase as the input voltage fed to the grid 34 by the resonance circuit of inductance 32 and capacitor 19, singing would occur as soon as the voltage fed back over capacitance 43 will be strong enough to sustain oscillations, as is known in the art. This fed back voltage depends on one hand on the value of the inherent capacity 43 which is determined by the geometric dimensions of the tube and on the other hand by the frequency of the signal to be amplified and increases with increasing frequency, as the resistivity of a capacitance, as is known in the art, decreases then.

To counteract this undesirable feedback through the inherent capacitance 43 I have provided an inductive negative feedback by connecting a tap of the inductance coil 32 forming a part of the resonant circuit connected to the grid 34 to ground and to connect that end of said inductance coil 32 which is far from the grid 34, to the cathode 38 through the coupling capacitor 37. Said coupling capacitor 37 serves simultaneously to by-pass the cathode resistor 39 in part as is known in the art.

When because of variations in the current flowing between cathode and anode the potential of the cathode 38 varies under the combined influence of the cathode resistor 39 and that part of the inductance coil 32 lying between the cathode 38 and ground, as determined by the tap 36, this variation is reflected inversely on the other end of said inductance coil 32 which end is coupled to the grid 34. This reflecting action is due to an autotransformer effect which is common to all coils a part of which is fed by an alternating current source as is known in the art. As the tap is on fixed potential, in the instant case ground, the one end will go up and the other end will go down, the relative amount of said variations relative to each being determined by the position of the tap 36 so that the variation of that end of the coil which is connected to the grid 34 may be adjusted according to the particular requirements of the actual circuit. The variation of end of the coil 32 connected to the grid 34 may further be influenced by adjustment of the capacitor 37 the value of which may be chosen to eliminate more or less the influence of the cathode resistor 39 the value of which must be chosen to polarise the cathode 38 with respect to grid 34 in accordance with the usual practice, as this cathode resistor 39 may by bypassed completely or not at all according to the value of the capacitor 37 as is known in the art.

To all those skilled in the art it will now be apparent that by my novel circuit an effective negative feedback from the output circuit of the 2nd triode to the input circuit of the same triode is provided the amount of which negative feedback increases with increasing frequency because the effect of inductance increases then so that the effective resistance for the alternating part of the current flowing through the cathode 38 will find increasing resistivity in that part of the inductance coil 32 connected to the cathode 38 so that an accordingly increasing voltage drop results which is reflected proportionally to the grid 34 by the autotransformer action of the entire coil 32. Now it is apparent that the value of such reflected voltage appearing at the grid 34 may easily be chosen equal to the value of the voltage fed back by the inherent capacitance 43 and that this negative feedback will be effective to counteract completely said positive feedback through inherent capacitance 43.

Having now particularly described one preferred embodiment of my invention I claim:

1. Radio frequency amplifier stage having extremely wide bandwidth, comprising an amplifying means the input terminal of which is coupled to the output terminal of a preceding stage by means permitting the flow of alternating current only from said preceding stage to said input terminal and further coupled to a tunable circuit consisting of a capacitance and an inductance which are both coupled with one end to said input terminal while the other end of said inductance is coupled to a terminal of said amplifying means common to both its input and its output circuit, a tap of said inductance intermediate its ends being coupled to ground so as to reflect any change in the potential of said common terminal in the inverse sense to said input terminal in an amount increasing with the frequency of said change, the other end of said capacitance being connected to the same terminal of said amplifying means as said other end of said inductance, and an inherent capacitance, being inherent capacitance exclusively, and connecting said input terminal with the output terminal of the same stage.

2. Radio frequency amplifier stage having extremely wide bandwidth, comprising a vacuum tube having a control grid connected to an input terminal which is coupled to the output terminal of a preceding stage by means permitting the flow of alternating current only from said preceding stage to said control grid and further coupled to a tunable circuit consisting of a capacitance and an inductance which are both coupled with one end to said control grid while the other end of said inductance is coupled to a terminal of said vacuum tube common to both its input and its output circuit, a tap of said inductance intermediate its ends being coupled to ground so as to reflect any change in the potential of said common terminal in the inverse sense to said control grid in an amount increasing with the frequency of said change, the other end of said capacitance being connected to the other terminal of said vacuum tube as said other end of said inductance, and an inherent capacitance, being inherent capacitance exclusively, and connecting said input terminal with the output terminal of the same stage.

3. Radio frequency amplifier stage having extremely wide bandwidth, comprising a vacuum tube having a control grid connected to an input terminal which is coupled to the output terminal of a preceding stage by a coupling capacity and further coupled to a tunable circuit consisting of a capacitance and an inductance which are both coupled with one end to said control grid while the other end of said inductance is coupled to a terminal of said vacuum tube common to both its input and its output circuit, a tap of said inductance intermediate its ends being coupled to ground so as to reflect any change in the potential of said common terminal in the inverse sense to said control grid in an amount increasing with the frequency of said change, the other end of said capacitance being connected to the other terminal of said vacuum tube as said other end of said inductance, and an inherent capacitance, being inherent capacitance exclusively, and connecting said input terminal with the output terminal of the same stage.

4. Radio frequency amplifier stage having extremely wide bandwidth comprising a vacuum tube having a control grid connected to an input terminal which is coupled to the out-put terminal of a preceding stage by means permitting the flow of alternating current only from said preceding stage to said control grid and further coupled to a tunable circuit consisting of a variable capacitor and an inductance which are both coupled with one end to said control grid while the other end of said inductance is coupled to a terminal of said vacuum tube common to both its input and its output circuit, a tap of said inductance intermediate its ends being coupled to ground so as to reflect any change in the potential of said common terminals in the inverse sense to said control grid in an amount increasing with the frequency of said change, the other end of said capacitance being connected to the other terminal of said vacuum tube as said other end of said inductance, and an inherent capacitance, being inherent capacitance exclusively, and connecting said input terminal with the output terminal of the same stage.

References Cited in the file of this patent

UNITED STATES PATENTS

| | | |
|---|---|---|
| 2,226,074 | Root | Dec. 24, 1940 |
| 2,404,809 | O'Brien | July 30, 1946 |
| 2,550,930 | Koch | May 1, 1951 |
| 2,571,045 | Machee | Oct. 9, 1951 |
| 2,668,198 | Bussard | Feb. 2, 1954 |
| 2,775,655 | Bordewijk et al. | Dec. 25, 1956 |
| 2,789,212 | Achenbach et al. | Apr. 16, 1957 |
| 3,044,022 | Tongue | July 10, 1962 |

FOREIGN PATENTS

| | | |
|---|---|---|
| 184,216 | Austria | Dec. 27, 1955 |